(12) United States Patent
Ju et al.

(10) Patent No.: US 11,585,704 B2
(45) Date of Patent: Feb. 21, 2023

(54) STRUCTURE FOR DETECTING TEMPERATURE OF ELECTRONIC DEVICE

(71) Applicant: Samsung Electronics Co., Ltd., Suwon-si (KR)

(72) Inventors: Wanjae Ju, Seongnam-si (KR); Hyoseok Na, Yongin-si (KR); Chanho Park, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/206,783

(22) Filed: Mar. 19, 2021

(65) Prior Publication Data

US 2021/0208008 A1    Jul. 8, 2021

Related U.S. Application Data

(63) Continuation of application No. 16/786,100, filed on Feb. 10, 2020, now Pat. No. 10,955,298, which is a (Continued)

(30) Foreign Application Priority Data

Jul. 18, 2017    (KR) .................. 10-2017-0091170

(51) Int. Cl.
*G01K 7/22* (2006.01)
*G01K 1/16* (2006.01)
(Continued)

(52) U.S. Cl.
CPC ............ *G01K 7/22* (2013.01); *G01K 1/14* (2013.01); *G01K 1/16* (2013.01); *G06F 1/1626* (2013.01); *G06F 1/203* (2013.01); *G06F 1/206* (2013.01)

(58) Field of Classification Search
CPC . H01C 7/02; H01C 7/04; H01C 7/008; G01K 7/22; G01K 1/14; G01K 1/16
See application file for complete search history.

(56) References Cited

U.S. PATENT DOCUMENTS 8,595,517 B2    11/2013    Riechel et al.
9,213,361 B1    12/2015    Urban
(Continued)

FOREIGN PATENT DOCUMENTS

CN    101609978 A    12/2009
CN    104078641 A    10/2014
(Continued)

OTHER PUBLICATIONS

International Search Report dated Oct. 25, 2018, issued in International Application No. PCT/KR2018/008108.
(Continued)

*Primary Examiner* — Kyung S Lee
(74) *Attorney, Agent, or Firm* — Jefferson IP Law, LLP

(57) ABSTRACT

An electronic device is provided. The electronic device includes a housing configured to form an external shape thereof, a first board disposed in a first direction that is away from the housing, wherein at least one processor is mounted at the first board, a second board disposed between the housing and the first board and electrically connected with the first board, and a thermistor mounted on the second board, wherein the at least one processor measures a temperature of the housing based on an electrical signal received from the second board.

6 Claims, 14 Drawing Sheets

Related U.S. Application Data continuation of application No. 16/038,746, filed on Jul. 18, 2018, now Pat. No. 10,557,757.

(51) Int. Cl.
*G06F 1/16* (2006.01)
*G01K 1/14* (2021.01)
*G06F 1/20* (2006.01)

(56) References Cited

U.S. PATENT DOCUMENTS

| | | |
|---|---|---|
| 9,606,591 B2 | 3/2017 | Kwon et al. |
| 9,641,014 B2 | 5/2017 | Sporck et al. |
| 10,198,049 B2 | 2/2019 | Kwon et al. |
| 10,365,168 B2 | 7/2019 | Ban |
| 2004/0212350 A1 | 10/2004 | Patino et al. |
| 2005/0286010 A1 | 12/2005 | Park et al. |
| 2009/0317699 A1 | 12/2009 | Gao et al. |
| 2011/0283132 A1 | 11/2011 | Song et al. |
| 2011/0301778 A1 | 12/2011 | Liang et al. |
| 2012/0039050 A1 | 2/2012 | Chang et al. |
| 2012/0049933 A1 | 3/2012 | Riechel et al. |
| 2013/0120630 A1 | 5/2013 | Kim et al. |
| 2013/0141866 A1 | 6/2013 | Refai-Ahmed |
| 2014/0071383 A1 | 3/2014 | Drolet |
| 2014/0118931 A1 | 5/2014 | Hata |
| 2014/0262161 A1 | 9/2014 | Weigand |
| 2014/0287276 A1 | 9/2014 | Yoo |
| 2015/0226585 A1 | 8/2015 | Yang |
| 2015/0229155 A1 | 8/2015 | Sporck et al. |
| 2015/0241285 A1 | 8/2015 | Schneider et al. |
| 2016/0069751 A1 | 3/2016 | Yang et al. |
| 2017/0006715 A1 | 1/2017 | Choi et al. |
| 2017/0047791 A1 | 2/2017 | Jang et al. |
| 2017/0131156 A1 | 5/2017 | Miura et al. |
| 2017/0172020 A1 | 6/2017 | Ye et al. |

FOREIGN PATENT DOCUMENTS

| | | |
|---|---|---|
| CN | 105282272 A | 1/2016 |
| CN | 105960619 A | 9/2016 |
| CN | 106325379 A | 1/2017 |
| CN | 206038181 A | 3/2017 |
| CN | 106912190 A | 6/2017 |
| JP | 2006-023738 A | 1/2006 |
| JP | 2011-133613 A | 7/2011 |
| JP | 2016-139297 A | 8/2016 |
| JP | 2017-059731 A | 3/2017 |
| KR | 10-2013-0066313 A | 6/2013 |
| KR | 10-2015-0103415 A | 9/2015 |
| KR | 10-2017-0019826 A | 2/2017 |
| KR | 10-2017-0023466 A | 3/2017 |
| WO | 2015123394 A1 | 8/2015 |

OTHER PUBLICATIONS

Extended European Search Report dated Apr. 28, 2020, issued in a counterpart European U.S. Appl. No. 18/835,653.
Chinese Office Action dated Aug. 31, 2020, issued in a counterpart Chinese Application No. 201880047794.3.
Chinese Office Action dated Apr. 22, 2022, issued in Chinese Patent Application No. 202111108849.7.
Chinese Notice of Allowance dated Jul. 29, 2022, issued in a counterpart Chinese Application No. 202111108849.7.
A Korean Decision to Grant a Patent dated Sep. 1, 2022, issued in a counterpart Korean Application No. 10-2022-0079569.
A U.S. Office Action dated Sep. 15, 2022, issued by the U.S. Patent and Trademark Office U.S. Appl. No. 17/206,795.
Extended European Search Report dated Nov. 9, 2022, issued in a counterpart European Application No. 22202218.8-1001.
Korean Office Action dated Jan. 2, 2023, issued in a counterpart Korean Application No. 10-2022-0079555.

STRUCTURE FOR DETECTING TEMPERATURE OF ELECTRONIC DEVICE

CROSS-REFERENCE TO RELATED APPLICATION(S)

This application is a continuation application of prior application Ser. No. 16/786,100, filed on Feb. 10, 2020, which will be issued as U.S. Pat. No. 10,955,298 on Mar. 23, 2021; which is a continuation application of prior application Ser. No. 16/038,746, filed on Jul. 18, 2018, which has issued as U.S. Pat. No. 10,557,757 on Feb. 11, 2020 and was based on and claimed priority under 35 U.S.C. § 119(a) of a Korean patent application number 10-2017-0091170, filed on Jul. 18, 2017, in the Korean Intellectual Property Office, the disclosure of which is incorporated by reference herein in its entirety.

BACKGROUND

1. Field

The disclosure relates to an electronic device. More particularly, the disclosure relates to a structure for detecting a temperature of a housing and a battery of an electronic device.

2. Description of the Related Art

With the development of mobile communication technology and processing technology, mobile terminal devices (hereinafter, electronic devices) may implement various functions as well as a communication function. In order to implement various functions, the electronic device includes various electronic components.

When the electronic device performs various functions, a processor, memory, and battery within the electronic device may emit a heat as a byproduct of their operation. Such heat may be transferred to a user through a housing which may be dangerous, thus, accurate sensing of heat is required.

A conventional electronic device was configured to mount at least one thermistor on a main printed circuit board (PCB) and to measure a surrounding temperature of the thermistor according to an electrical signal of the thermistor. Because the thermistor is mounted together with other elements (e.g., processor, memory) on the PCB, a temperature of the thermistor changes according to a temperature change of peripheral components. Thus, when a lot of heat is produced by an element such as the processor, there is a problem that the thermistor may not accurately measure the temperature.

Further, in some situations, a large difference may occur between an internal temperature of the electronic device and an external temperature of a portion with which a user contacts, and in this case, the effect of temperature control in which the user directly performs may be deteriorated.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an apparatus and method for providing a temperature detection structure of an electronic device that can accurately sense a temperature of a battery and a specific area (e.g., a rear cover) of the housing.

Additional aspects will be set forth in part in the description which follows and, in part, will be apparent from the description, or may be learned by practice of the presented embodiments.

In accordance with an aspect of the disclosure, an electronic device is provided. The electronic device a housing configured to form an external shape thereof, a first board disposed in a first direction that is away from the housing, wherein at least one processor is mounted at the first board, a second board disposed between the housing and the first board and electrically connected with the first board, and a thermistor mounted on the second board, wherein the at least one processor measures a temperature of the housing based on an electrical signal received from the second board.

In accordance with another aspect of the disclosure, an electronic device is provided. The electronic device includes a housing configured to form an external shape thereof, a first board disposed in a first direction that is away from the housing, and a thermistor disposed between the housing and the first board, wherein a distance between the thermistor and the housing is smaller than that between the thermistor and the first board.

In accordance with another aspect of the disclosure, an electronic device is provided. The electronic device includes a housing configured to form an external shape thereof, a battery disposed in a first direction that is away from the housing, a first board disposed in the first direction, a second board in which at least a portion of the battery is disposed in the first direction at first area and in which at least a portion of the first board is disposed in the first direction at a second area different from the first area, and a first thermistor mounted in the first area of the second board and a second thermistor mounted in the second area of the second board.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
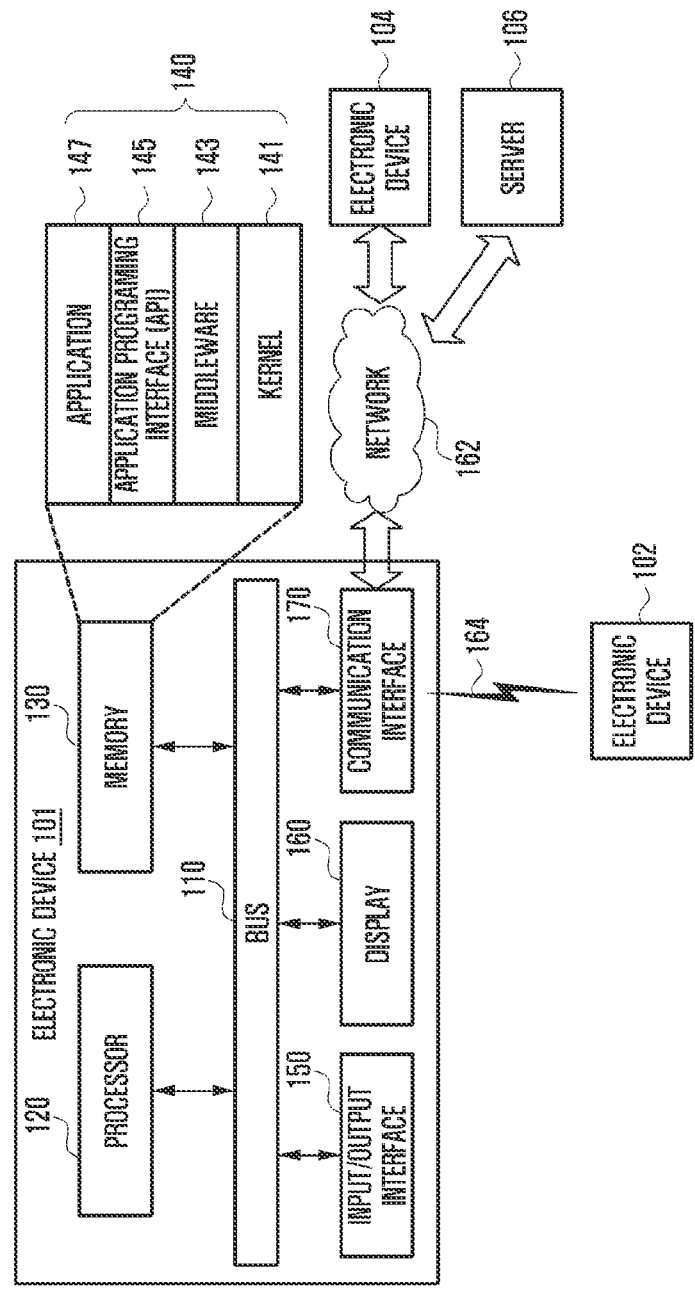
FIG. 1 is a block diagram illustrating a configuration of an electronic device in a network environment according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

An expression "comprising" or "may comprise" used in the disclosure indicates presence of a corresponding function, operation, or element and does not limit additional at least one function, operation, or element. Further, in the disclosure, a term "comprise" or "have" indicates presence of a characteristic, numeral, step, operation, element, component, or combination thereof described in the disclosure and does not exclude presence or addition of at least one other characteristic, numeral, step, operation, element, component, or combination thereof.

In the disclosure, an expression "or" includes any combination or the entire combination of together listed words. For example, "A or B" may include A, B, or A and B.

An expression of a first and a second in the disclosure may represent various elements of the disclosure, but do not limit corresponding elements. For example, the expression does not limit order and/or importance of corresponding elements. The expression may be used for distinguishing one element from another element. For example, both a first user device and a second user device are user devices and represent different user devices. For example, a first constituent element may be referred to as a second constituent element without deviating from the scope of the disclosure, and similarly, a second constituent element may be referred to as a first constituent element.

When it is described that an element is "coupled" to another element, the element may be "directly coupled" to the other element or "electrically coupled" to the other element through a third element. However, when it is described that an element is "directly coupled" to another element, no element may exist between the element and the other element.

Terms used in the disclosure are not to limit the disclosure but to illustrate example embodiments. When using in a description of the disclosure and the appended claims, a singular form includes a plurality of forms unless it is explicitly differently represented.

Unless differently defined, entire terms including a technical term and a scientific term used here have the same meaning as a meaning that may be generally understood by a person of common skill in the art. It should be understood that generally using terms defined in a dictionary have a meaning corresponding to that of a context of related technology and are not analyzed as an ideal or excessively formal meaning unless explicitly defined.

In this disclosure, an electronic device may be a device that involves a communication function. For example, an electronic device may be a smart phone, a tablet personal computer (PC), a mobile phone, a video phone, an e-book reader, a desktop PC, a laptop PC, a netbook computer, a personal digital assistant (PDA), a portable multimedia player (PMP), an MP3 player, a portable medical device, a digital camera, or a wearable device (e.g., an head-mounted device (HMD) such as electronic glasses, electronic clothes, an electronic bracelet, an electronic necklace, an electronic accessory, or a smart watch), or the like, but is not limited thereto.

According to some embodiments, an electronic device may be a smart home appliance that involves a communication function. For example, an electronic device may be a TV, a digital video disc (DVD) player, audio equipment, a refrigerator, an air conditioner, a vacuum cleaner, an oven, a microwave, a washing machine, an air cleaner, a set-top box, a TV box (e.g., Samsung HomeSync™, Apple TV™, Google TV™, etc.), a game console, an electronic dictionary, an electronic key, a camcorder, or an electronic picture frame.

According to some embodiments, an electronic device may be a medical device (e.g., magnetic resonance angiography (MRA), magnetic resonance imaging (MRI), computed tomography (CT), ultrasonography, etc.), a navigation device, a global positioning system (GPS) receiver, an event data recorder (EDR), an flight data recorder (FDR), a car infotainment device, electronic equipment for ship (e.g., a marine navigation system, a gyrocompass, etc.), avionics, security equipment, or an industrial or home robot, or the like, but is not limited thereto.

According to some embodiments, an electronic device may be furniture or part of a building or construction having a communication function, an electronic board, an electronic signature receiving device, a projector, or various measuring instruments (e.g., a water meter, an electric meter, a gas meter, a wave meter, etc.), or the like, but is not limited thereto. An electronic device disclosed herein may be one of the above-mentioned devices or any combination thereof. As well understood by those skilled in the art, the above-mentioned electronic devices are examples only and not to be considered as a limitation of this disclosure.

FIG. 1 is a block diagram illustrating an example electronic device in a network environment according to an example embodiment of the disclosure.

Referring to FIG. 1, the electronic device 101 may include a bus 110, a processor (e.g., including processing circuitry) 120, a memory 130, an input/output interface (e.g., including input/output circuitry) 150, a display 160, and a communication interface (e.g., including communication circuitry) 170.

The bus 110 may be a circuit for interconnecting elements described above and for allowing a communication, e.g. by transferring a control message, between the elements described above.

The processor 120 can receive commands from the above-mentioned other elements, e.g. the memory 130, the input/output interface 150, the display 160, and the communication interface 170, though, for example, the bus 110, can decipher the received commands, and perform operations and/or data processing according to the deciphered commands.

The memory 130 can store commands received from the processor 120 and/or other elements, e.g. the input/output interface 150, the display 160, and the communication interface 170, and/or commands and/or data generated by the processor 120 and/or other elements. The memory 130 may include software and/or programs 140, such as a kernel 141, middleware 143, an application programming interface (API) 145, and an application 147. Each of the programming modules described above may be configured by software, firmware, hardware, and/or combinations of two or more thereof.

The kernel 141 can control and/or manage system resources, e.g. the bus 110, the processor 120 or the memory 130, used for execution of operations and/or functions implemented in other programming modules, such as the middleware 143, the API 145, and/or the application 147. Further, the kernel 141 can provide an interface through which the middleware 143, the API 145, and/or the application 147 can access and then control and/or manage an individual element of the electronic device 101.

The middleware 143 can perform a relay function which allows the API 145 and/or the application 147 to communicate with and exchange data with the kernel 141. Further, in relation to operation requests received from at least one of an application 147, the middleware 143 can perform load balancing in relation to the operation requests by, for example, giving a priority in using a system resource, e.g. the bus 110, the processor 120, and/or the memory 130, of the electronic device 101 to at least one application from among the at least one of the application 147.

The API 145 is an interface through which the application 147 can control a function provided by the kernel 141 and/or the middleware 143, and may include, for example, at least one interface or function for file control, window control, image processing, and/or character control.

The input/output interface 150 may include various input/output circuitry and can receive, for example, a command and/or data from a user, and transfer the received command and/or data to the processor 120 and/or the memory 130 through the bus 110. The display 160 can display an image, a video, and/or data to a user.

The communication interface 170 can establish a communication between the electronic device 101 and other electronic devices 102 and 104 and/or a server 106. The communication interface 170 can support short range communication protocols 164, e.g. a Wireless Fidelity (WiFi) protocol, a Bluetooth (BT) protocol, and a near field communication (NFC) protocol, communication networks, e.g. Internet, local area network (LAN), wire area network (WAN), a telecommunication network, a cellular network, and a satellite network, or a plain old telephone service (POTS) or any other similar and/or suitable communication networks, such as network 162, or the like. Each of the electronic devices 102 and 104 may be a same type and/or different types of electronic device.

Figure 2:
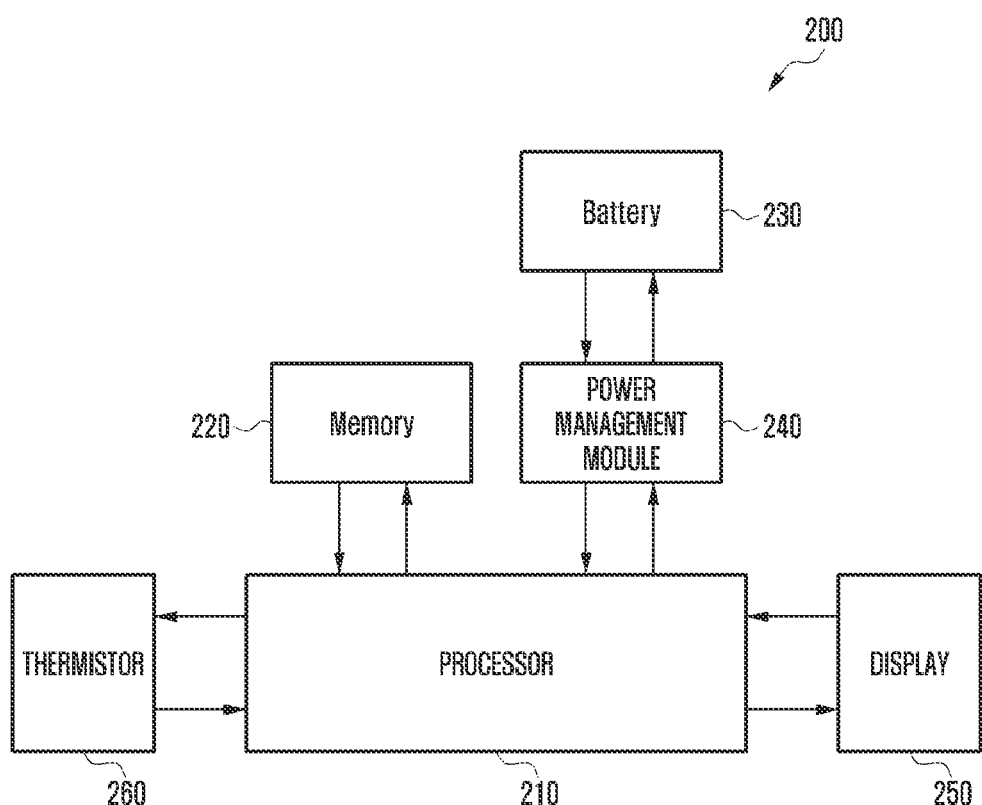
FIG. 2 is a block diagram illustrating a configuration of an electronic device according to an embodiment of the disclosure.

FIG. 2 is a block diagram illustrating a configuration of an electronic device according to an embodiment of the disclosure.

Referring to FIG. 2, an electronic device 200 may include a processor 210, memory 220, battery 230, power management module 240, display 250, and thermistor 260, and even if at least a portion of the shown elements is omitted or replaced, various embodiments of the disclosure may be implemented. The electronic device 200 may further include at least some of configurations and/or functions of the electronic device 101 of FIG. 1.

According to various embodiments, the shown elements and various elements that are not shown may be received in a housing (not shown). The housing forms an external shape of the electronic device, some elements (e.g., the processor 210, memory 220, battery 230, and power management module 240) of the electronic device 200 may be disposed inside the housing, and some other elements (e.g., the display 250) may be disposed outside the housing. According to an embodiment, the electronic device 200 may have a portion (e.g., a rear portion of the housing) of the housing or a cover (not shown) that may separate from the housing at a rear surface. The cover may be implemented with various materials of a metal or a nonmetal such as plastic. According to an embodiment, the electronic device 200 may be provided with an integral housing without a separate cover, and in this case, a material (e.g., metal) constituting at least a portion of a front surface and/or a side surface of the housing and a material (e.g., plastic) constituting the rear surface may be different. Hereinafter, the rear surface of the housing may mean a rear area of the housing formed in a one piece or may mean a detachable separate cover provided at a rear surface of the housing.

According to various embodiments, the processor 210 may perform an operation or data processing related to the control and/or communication of each element of the electronic device 200 and include at least some of configurations and/or functions of the processor 120 of FIG. 1. The processor 210 may be electrically connected to internal elements of the electronic device 200, such as the memory 220, the display 250, the power management module 240, and the thermistor 260. The processor 210 may be mounted on a main printed circuit board (PCB) (or the first board), and the main PCB may mount various elements of the electronic device 200, such as the memory 220 and the power management module 240.

According to various embodiments, the memory 220 may store temporarily or permanently unlimited digital data and include at least some of configurations and/or functions of the memory 130 of FIG. 1. The memory 220 may store various instructions that may be performed in the processor 210. Such instructions may include a control command such as arithmetic and logic operations, a data movement, and an input and output that may be recognized by the processor 210 and may be defined on a framework stored at the memory 220. Further, the memory 220 may store at least a portion of the program 140 of the FIG. 1.

According to various embodiments, operation and data processing functions are not limited in which the processor 210 may implement within the electronic device 200, but in this specification, a temperature of at least a portion of the electronic device 200 may be detected from an electrical signal received from the thermistor 260 and technical characteristics for providing feedback thereof to the user will be described. Operations performed in the processor 210 may be performed by loading instructions stored at the memory 220.

According to various embodiments, the battery 230 may supply power to at least one element of the electronic device 200 such as the processor 210 and the memory 220.

According to various embodiments, the power management module 240 manages power supplied from the battery 230 to each element of the electronic device 200 and may be configured as at least a portion of a power management integrated circuit (PMIC).

According to various embodiments, the display 250 displays an image, may be implemented into any one of a liquid crystal display (LCD), light-emitting diode (LED) display, organic light-emitting diode (OLED) display, micro electro mechanical systems (MEMS) display, and electronic paper (e-paper) display, but it is not limited thereto. The display 250 may include at least some of configurations and/or functions of the display 160 of FIG. 1.

According to various embodiments, the electronic device 200 may include at least one thermistor 260 for detecting a temperature. The thermistor (thermally sensitive resistor) 260 may be produced by sintering a semiconductor device, for example, metal oxide such as manganese, nickel, cobalt, iron, copper, and titanium having a property in which a resistance value sensitively decreases when a temperature increases. In this specification, it is described that the electronic device uses the thermistor as an element for detecting a temperature, but the disclosure is not limited thereto and the electronic device can use various devices for detecting a temperature other than the thermistor. In this case, the thermistor of FIGS. 2 to 13 may be replaced with any other device for detecting a temperature.

When a temperature of the thermistor 260 increases due to a heat generated within the electronic device 200, a resistance value of the thermistor 260 increases; thus, a voltage value (or a current value) applied to the thermistor 260 may be changed. The processor 210 may determine a temperature of the thermistor 260 based on an electrical signal (e.g., a voltage value or a current value) detected by the thermistor 260. A circuit for measuring a temperature through an electrical signal of the thermistor 260 will be described in detail later with reference to FIG. 13.

According to various embodiments, the electronic device 200 may have at least one thermistor 260 in each area therein, and at least some thereof may be mounted on the first board (e.g., a main PCB) in which the processor 210 and the memory 220, etc. are mounted.

According to various embodiments, at least one thermistor 260 that is not mounted on the first board may be mounted on the second board (e.g., flexible printed circuit board (FPCB)). Here, the second board may be provided for mounting of the thermistor 260 and electrical connection to the first board. Various embodiments in which the thermistor 260 is mounted on the second board will be described in detail later with reference to FIGS. 4 to 8. According to other embodiments, the thermistor 260 is a sheet type and may be attached to a particular area of the electronic device 200 without a separate FPCB. The embodiment will be described in detail with reference to FIG. 8.

According to various embodiments, the first board and the second board are electrically connected to each other, and the processor 210 may determine a temperature of a partial area (e.g., a rear housing) of the housing through an electrical signal transferred from the thermistor 260 mounted on the second board and a temperature of each element, provided in the housing of the electronic device 200, such as the battery 230.

According to various embodiments, the processor 210 may control a performance of the processor 210 or may control charge of the battery 230 according to the measured temperature. Further, the processor 210 may provide various feedback related to a temperature to the user through the display 250, a speaker, or a haptic module.

Figure 3A:
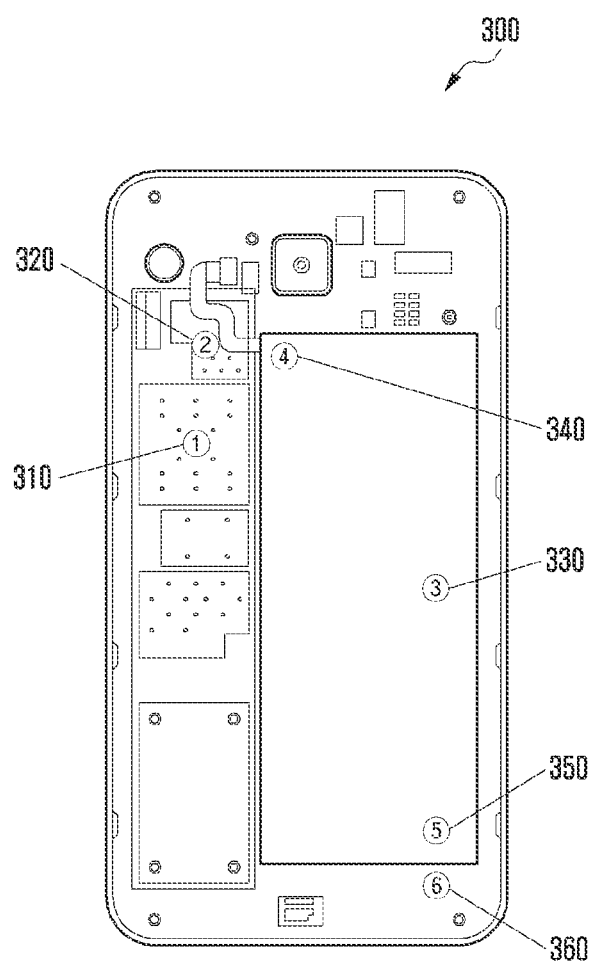
FIGS. 3A and 3B are a diagram and a temperature measurement graph, respectively, of an electronic device according to various embodiments of the disclosure.
Figure 3B:
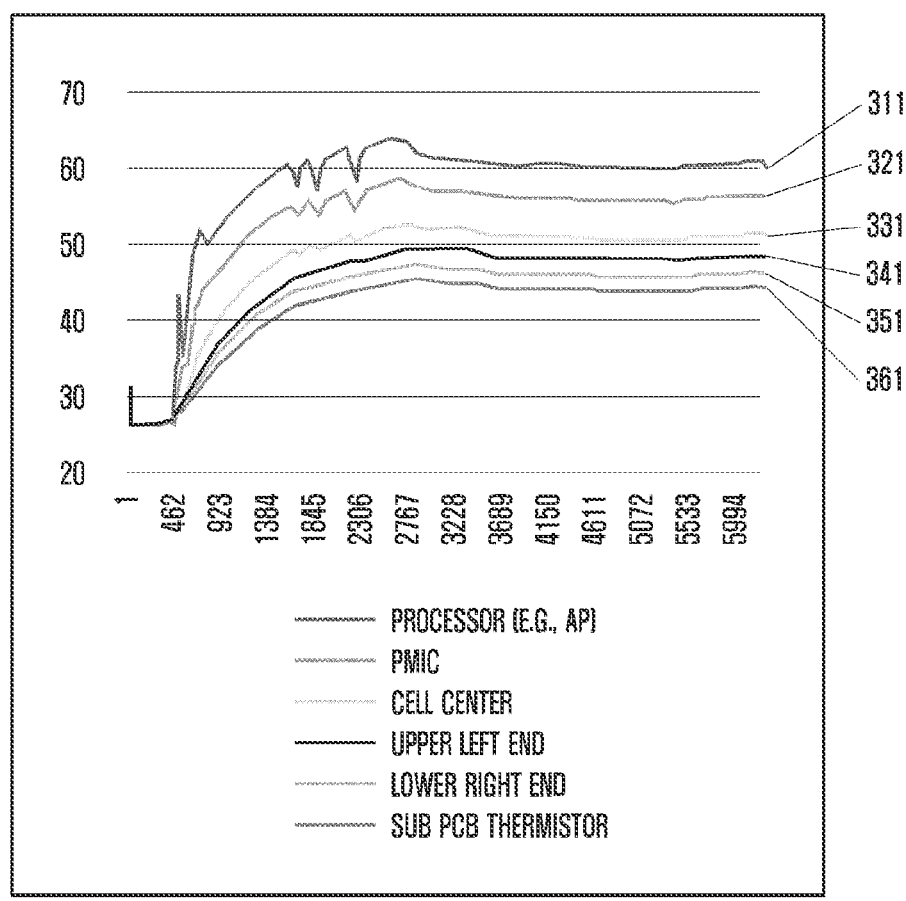

FIG. 3A is a diagram illustrating a rear surface of an electronic device according to an embodiment of the disclosure. FIG. 3B illustrates a temperature measurement graph of an electronic device according to an embodiment of the disclosure.

FIG. 3A illustrates a housing whose portion (e.g., rear housing) is removed from a rear surface of an electronic device 300, and FIG. 3B is a graph of a temperature measured in each area of FIG. 3A.

Referring to FIGS. 3A and 3B, at a processor at a position 310 and a power management integrated circuit (PMIC) at a position 320 of the electronic device 300, the center 330, the upper left end 340, and the lower right end 350 of the battery, and the lower end area 360 of the PCB, temperatures may be measured. As shown in the graph of FIG. 3B, it may be determined that a temperature is high in order of a processor 311 and a PMIC 321 of the electronic device 300, the center 331, the upper left end 341, and the lower right end 351 of the battery, and the lower end 361 of the PCB.

When the electronic device 300 mounts a thermistor on a main PCB, only in a position 310 adjacent to the processor, a position 320 adjacent to the PMIC, and a lower end area 360 of the PCB on the main PCB among six areas of FIG. 3A, thermistors may be disposed. In this case, the electronic device 300 may measure a temperature of corresponding areas 310, 320, and 360 through the thermistors disposed at the corresponding areas 310, 320, and 360 and estimate a temperature of each area using a temperature difference measured in a pre-test between the remaining areas 330, 340, and 350 and the disposition areas 310, 320, and 360 of the thermistor. However, this is an estimation value that does not directly measure a temperature of each area and has a drawback that cannot accurately measure a temperature in real time. Further, at a position 310 adjacent to the processor and a position 320 adjacent to the PMIC, because the thermistors may be disposed to contact with the processor and the PMIC on the main PCB, even if the thermistors are disposed at corresponding positions, a temperature of the processor and the PMIC cannot be accurately measured.

According to various embodiments of the disclosure, the electronic device 300 may include at least one thermistor (e.g., the thermistor 260 of FIG. 2) disposed adjacent to a portion (e.g., a rear surface of the housing) of the housing to more accurately measure a temperature of the housing. For example, the electronic device 300 may include a first board (e.g., a main PCB) disposed in a first direction (e.g., a rear direction) of the housing and in which at least one processor (e.g., the processor 210) is mounted, a second board (e.g., an FPCB) disposed between the housing and the first board and electrically connected to the first board, and a thermistor mounted in the second board.

FIGS. 4 to 8 are diagrams illustrating a disposition structure of a thermistor for more accurately measuring a temperature of a housing of an electronic device according to various embodiments of the disclosure.

FIGS. 4 to 8 illustrate a disposition structure of a thermistor for accurately measuring a temperature of a rear surface of the housing of the electronic device. Hereinafter, a downward direction of the drawing corresponding to a front direction in which a cover of the electronic device (e.g., the electronic device 200 of FIG. 2) is positioned may be referred to a first direction, and an upward direction of the drawing corresponding to a rear direction in which the display (e.g., the display 250 of FIG. 2) of the electronic device is positioned may be referred to a second direction. Further, in a configuration having both surfaces such as the cover, the first board, and the second board, a surface toward the first direction may be referred to a first surface, and a surface toward the second direction may be referred to a second surface.

According to other embodiments, the electronic device may dispose thermistors in at least a portion of a side surface of the housing, a front window, and a bezel area. In this case, the first direction may mean a direction toward the inside of the electronic device based on a surface of the housing (or window) in which the thermistor is disposed, and the second direction may mean a direction toward the outside of the electronic device. In the embodiment, although not described in detail hereinafter, in a structure of FIGS. 4 to 8, it may be easily understood that rear housings 410, 510, 610, 710, and 810 may be replaced with a side surface of the housing, a front window, and a bezel area.

First, a first embodiment of FIG. 4 will be described.

Figure 4:
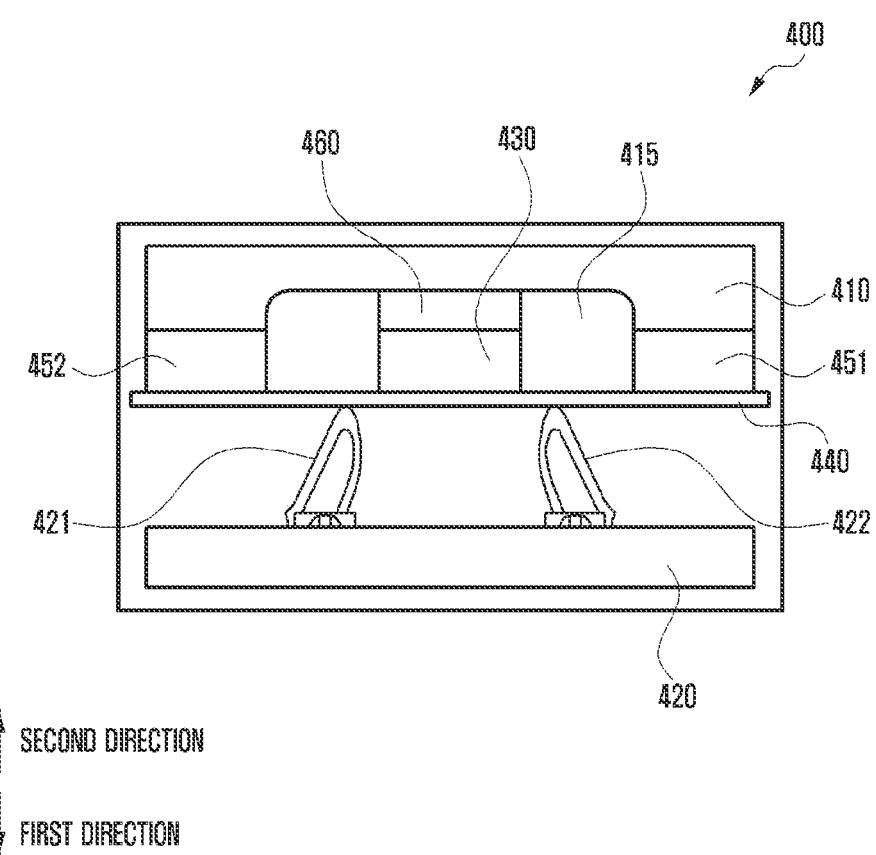
FIGS. 4, 5, 6, 7, and 8 are diagrams illustrating a thermistor disposition structure of an electronic device in a lateral direction according to various embodiments of the disclosure.

According to various embodiments, as shown in FIG. 4, in a first direction (e.g., a front direction of an electronic device 400) of a rear housing 410, a first board 420 may be disposed, and a second board 440 may be disposed between the rear housing 410 and the first board 420.

According to various embodiments, the first board 420 may be a main PCB that may mount various elements such as a processor (e.g., the processor 210 of FIG. 2) and a memory (e.g., the memory 220 of FIG. 2). Further, the second board 440 may be a flexible printed circuit board (FPCB) in which a thermistor 430 is mounted. According to an embodiment, the second board 440 (or FPCB) is an element for mounting of the thermistor 430 and electrical connection to the first board 420, a plurality of thermistors 430 may be mounted within one second board 440, and the electronic device 400 may include a plurality of thermistors 430 corresponding to at least one thermistor 430 according to a disposition position of the thermistor 430.

According to various embodiments, two connecting portions 421 and 422 may be used to electrically connect the first board 420 and the second board 440. The two connecting portions 421 and 422 may be separate or included with the first board 420 or the second board 440. The connecting portions 421 and 422 for electrical connection of the first board 420 and the second board 440 may use various methods such as a C-Clip, contact pad, and connector form. According to an embodiment, at least one connecting portion (not shown) may be included for electrically connecting the first board 420 to an element such as another circuit board other than the second board 440. The descriptions of connecting portions 421 and 422 may be equally applicable to any other connecting portion referred to herein.

According to various embodiments, as shown in FIG. 4, the thermistor 430 may be disposed at a second surface of a second direction (e.g., a rear direction of the electronic device 400) of the second board 440. According to the embodiment, in order to secure a disposition space of the thermistor 430, the rear housing 410 may be formed in a form in which at least a partial area including a disposition area 415 of the thermistor 430 has a groove.

According to an embodiment, the thermistor 430 may be disposed closer to the rear housing 410 rather than the first board 420.

According to an embodiment, at a first surface of the rear housing 410, first structures 451 and 452 for securing a space of the thermistor 430 may be disposed. A first surface of the first structures 451 and 452 may be attached to at least a portion of the second surface of the second board 440, and a second surface thereof may be attached to at least a portion of the first surface of the rear housing 410. According to an embodiment, the first structures 451 and 452 are made of a material such as a sponge and a tape and support a pressure in the first direction and/or the second direction to prevent a physical impact that may be applied to the thermistor 430. Further, in order to prevent a heat from being transferred from the outside to a space 415 in which the thermistor 430 is mounted, the first structures 451 and 452 may be made of a material having thermal conductivity of a reference value or less. Therefore, a heat transferred from the outside to a disposition area of the thermistor 430 may be blocked to the maximum.

According to an embodiment, in an area 415 in which the thermistor 430 is disposed, a distance between the rear housing 410 and the second board 440 may be greater than a length of a first direction and a second direction of the thermistor 430. In other words, the thermistor 430 may not directly contact with the rear housing 410.

Accordingly, upon contacting with the rear housing 410 made of a metal material and that may occur according to a pressure in the first direction and/or the second direction, a short phenomenon of a circuit including the thermistor 430 can be prevented and/or upon contacting with the rear housing 410 made of a metal or a nonmetal, damage by a physical impact of the thermistor 430 and the rear housing 410 can be prevented.

According to an embodiment, because a predetermined gap is formed between the rear housing 410 and the thermistor 430, the rear housing 410 and the thermistor 430 may not contact with each other. A length of the gap may be a length that enables the rear housing 410 and the thermistor 430 not to come in contact with each other even while using the electronic device 400 in consideration of elasticity of the second board 440 including the rear housing 410 and the thermistor 430. According to another embodiment, a second structure 460 for preventing a contact may be disposed between the rear housing 410 and the thermistor 430. A first surface of the second structure 460 may be attached to at least a portion of a second surface of the thermistor 430, and a second surface thereof may be attached to at least a portion of a second surface of the rear housing 410. The second structure 460 may be made of an insulating material to prevent the thermistor 430 and the rear housing 410 made of a metal material from being electrically connected.

Figure 5:
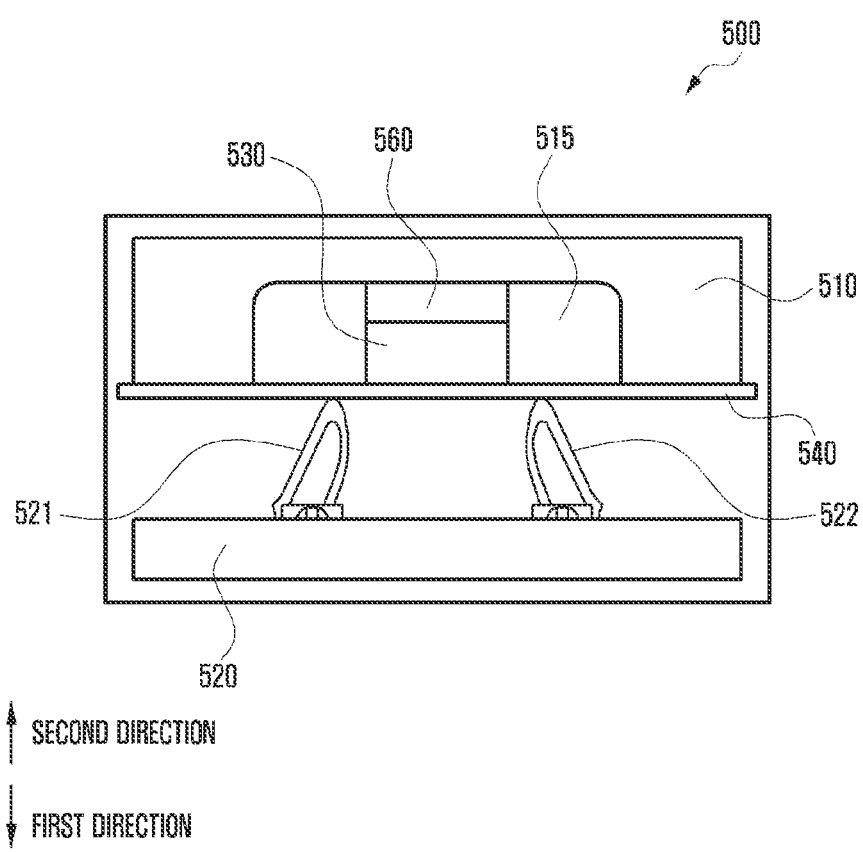

FIG. 5 illustrates a second embodiment of the disclosure. The second embodiment described with reference to FIG. 5 is somewhat different in a form of the rear housing, compared with the first embodiment described with reference to FIG. 4.

In an electronic device 500 according to the second embodiment, a first board 520 may be disposed in a first direction of a rear housing 510, a second board 540 may be disposed between the rear housing 510 and the first board 520, and a thermistor 530 may be disposed at a second surface of the second board 540. According to an embodiment, a second structure 560 for preventing contact may be disposed between the rear housing 510 and the thermistor 530.

Referring to FIG. 5, the rear housing 510 may have a thickness to receive the thermistor 530 according to an implementation of the electronic device 500. According to the embodiment, in order to secure a disposition space 515 of the thermistor 530, at least a partial area 515 including a disposition area of the thermistor 530 may be formed in a groove form and a thickness of the rear housing 510 is sufficient; thus, the rear housing 510 may not include a first structure (e.g., the first structures 451 and 452 of FIG. 4) for securing a space of the thermistor 530 unlike the first embodiment.

In the embodiment, because the rear housing 510 may enclose a side surface of the thermistor 530, a heat transferred from the outside to a disposition area of the rear housing 510 may be blocked.

According to various embodiments, two connecting portions 521 and 522 may be used to electrically connect the first board 520 and the second board 540.

Figure 6:
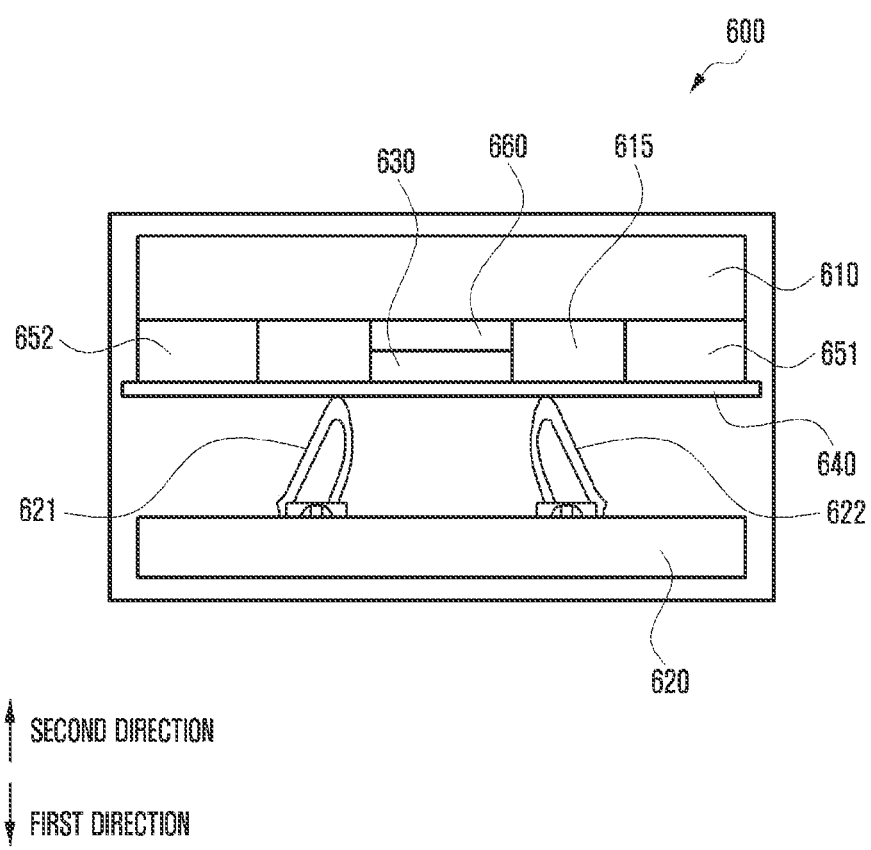

FIG. 6 illustrates a third embodiment of the disclosure. The third embodiment described with reference to FIG. 6 is an embodiment of a case of maintaining a flat shape without removing a partial area of the rear housing, compared with the first embodiment described with reference to FIG. 4 and the second embodiment described with reference to FIG. 5.

In an electronic device 600 according to the third embodiment, a first board 620 may be disposed in a first direction of a rear housing 610, a second board 640 may be disposed between the rear housing 610 and the first board 620, and a thermistor 630 may be disposed at a second surface of the second board 640. Further, a second structure 660 for preventing contact may be disposed between the rear housing 610 and the thermistor 630.

In an electronic device according to the embodiment, by disposing first structures 651 and 652 at a side surface of the thermistor 630, a disposition space 615 of the thermistor 630 can be secured.

According to various embodiments, two connecting portions 621 and 622 may be used to electrically connect the first board 620 and the second board 640.

According to various embodiments described with reference to FIGS. 4 to 6, at spaces (e.g., 415, 515, 615) in which thermistors (e.g., 430, 530, 630) are disposed, by blocking a heat generating at adjacent other spaces of the electronic device, a heat of the rear housing (e.g., 410, 510, 610) can be more accurately measured. Portions in which much heat occurs in the electronic device are a first board in which the processor and the memory are mounted and a display positioned in a first direction of the first board, and according to the embodiment described with reference to FIGS. 4 to 6, the second board may be provided between the first board and the thermistor to minimize an influence of a heat transferred in the second direction. Further, due to the second structures (e.g., 451, 452, 651, 652) or the rear housing, an influence of a heat transferred from a side surface of the thermistor may be minimized.

According to various embodiment described with reference to FIGS. 4 to 6, a thermistor is disposed in a second direction of the first board, but according to other embodiments, the thermistor may be disposed in a second direction of the battery (e.g., the battery 230 of FIG. 2). For example, the thermistor may be disposed at the center of the battery to measure a temperature of the battery. In this case, a size of the second board may be extended to cover both the first board and the battery. In other words, at least a portion of the first board may be disposed in at least a partial area of a first direction of the second board, and at least a portion of the battery may be disposed in at least another portion of a first direction of the second board.

In the embodiment, in an area in which the first board is disposed in the first direction of the second board, at least one connecting portion for electrical connection to the first board may be provided.

Figure 7:
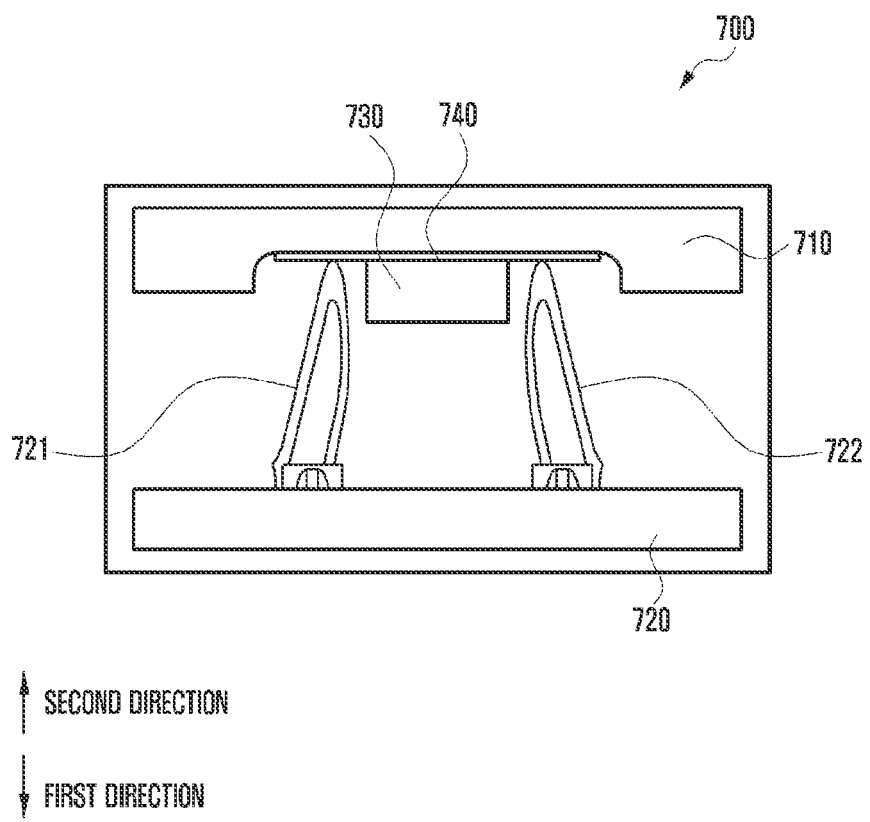

FIG. 7 illustrates a fourth embodiment of the disclosure.

According to various embodiments, a thermistor 730 may be disposed at a first surface of a first direction of a second board 740.

Referring to FIG. 7, at the first surface of the second board 740, connecting portions 721 and 722 for electrical connection with a first board 720 may be formed. A second surface of the second board 740 may be directly attached to a rear housing 710.

A structure of the fourth embodiment is a structure that enables the first board 720 and the connecting portions 721 and 722 and the thermistor 730 to be positioned at the same surface and that may be applied when a distance between the rear housing 710 and the first board 720 is small. In the embodiment, because the rear housing 710 and the second board 740 are attached directly in a large area, a temperature of the rear housing 710 may be transferred to the thermistor 730 through the second board 740.

According to an embodiment, the rear housing 710 and the second board 740 may be attached through a tape (e.g., 3M8804N tape that uses for heat spread of a heat pipe or CU sheet tape, which is a metal sheet of a copper material) of a high thermal conductive material to maximally transfer a heat of the rear housing 710 to the second board 740. Further, in the embodiment, the thermistor 730 may be more closely disposed to the rear housing 710 rather than the first board 720.

According to various embodiments, two connecting portions 721 and 722 may be used to electrically connect the first board 720 and the second board 740.

Figure 8:
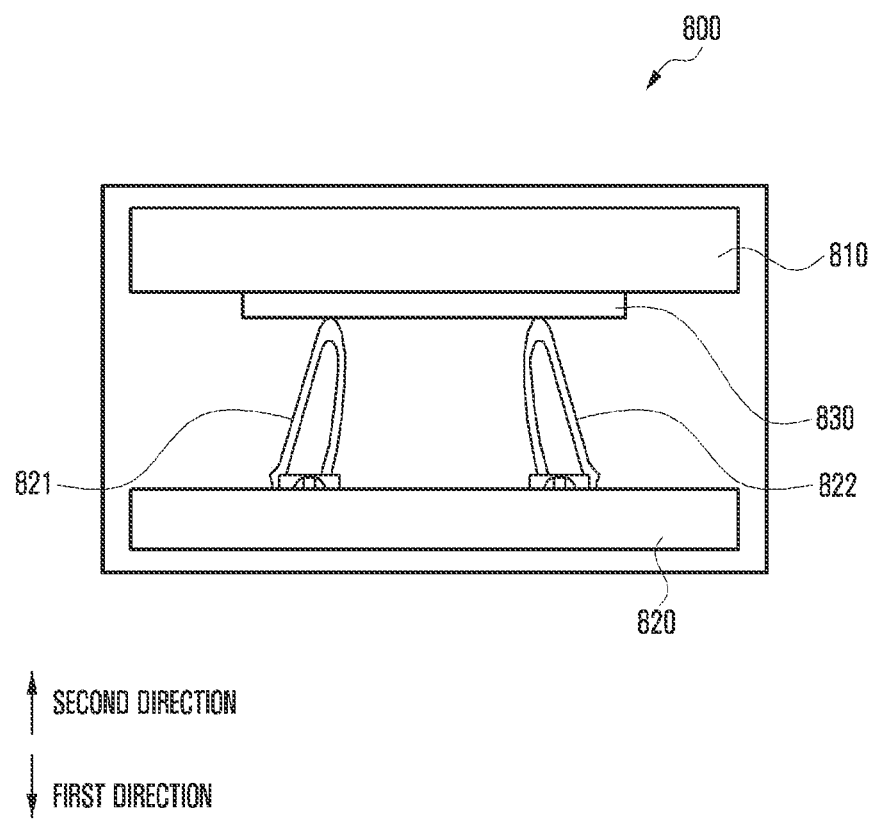

FIG. 8 illustrates a fifth embodiment of the disclosure.

According to various embodiments, an electronic device 800 may include a sheet type thermistor 830. For example, the sheet type thermistor 830 may be formed in a sheet or film type by widely spreading a negative temperature coefficient (NTC) material, which is a constituent element of the thermistor.

According to an embodiment, a second surface of the sheet type thermistor 830 and a first surface of a rear housing 810 may be directly attached to each other, and in this case, the second surface of the sheet type thermistor 830 and the first surface of the rear housing 810 may be attached through a tape of a high thermal conductive material. According to an embodiment, at a surface of the sheet type thermistor 830, connecting portions 821 and 822 for electrical connection with the first board 820 may be provided.

In the embodiment, because it is unnecessary to separately configure the thermistor (e.g., the thermistor 430 of FIG. 4) and the second board (e.g., the second board 440 of FIG. 4), there is a merit that the thermistor and the second board can be easily processed in various shapes and sizes and that a thickness of the electronic device 800 can be reduced.

In various embodiments described with reference to FIGS. 4 to 8, the thermistor (e.g., 430 of FIG. 4) is disposed adjacent to the rear housing to measure a temperature of the rear housing, but a disposition position of the thermistor is not limited thereto. For example, in the electronic device, by disposing the thermistor in at least a portion of a side surface of the housing, a front window, and a bezel area, a temperature of an internal configuration of the electronic device or an area of the housing in which the thermistor is disposed can be measured.

FIGS. 9 to 12 illustrate a disposition form of a thermistor and a second board according to various embodiments of the disclosure. FIGS. 9 to 12 are diagrams viewed in a first direction from a rear surface of an electronic device 900 and may have a form in which a rear housing (e.g., the rear housing 410 of FIG. 4) is removed.

Figure 9:
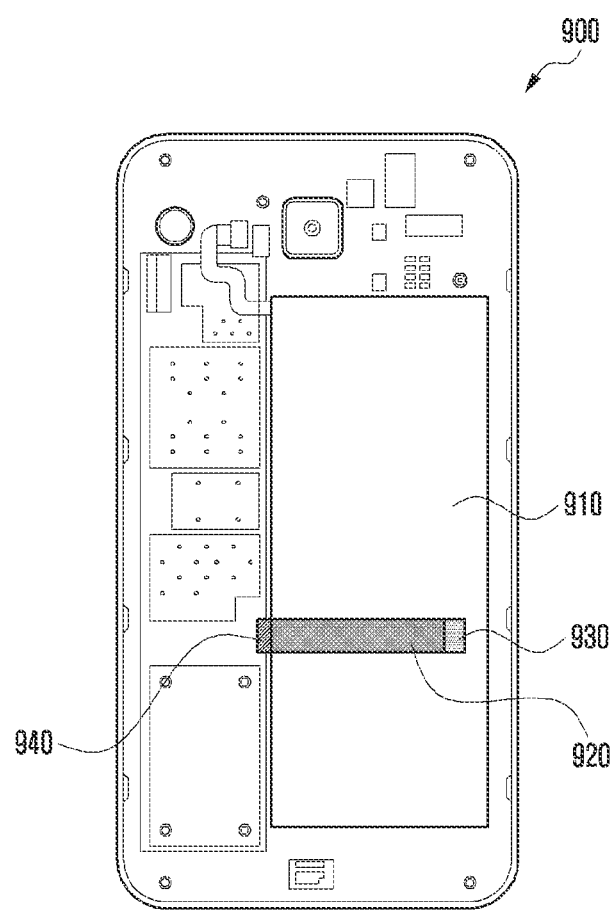
FIGS. 9, 10, 11, and 12 are diagrams illustrating a thermistor disposition structure of an electronic device in a rear direction according to various embodiments of the disclosure.

According to various embodiments, in at least a partial area of the first direction of the second board (the second board 440 of FIG. 4), at least a portion of the first board (e.g., the first board 420 of FIG. 4) may be disposed, and in at least another partial area thereof, at least a portion of a battery 910 may be disposed. That is, as shown in FIG. 9, a second board 920 may be formed to cover both a portion of the battery 910 and the first board in the first direction.

According to an embodiment described with reference to FIG. 9, a thermistor 930 may be disposed in an area (e.g., a second direction of the center of the battery) in which a battery is disposed in the first direction. Accordingly, the thermistor 930 can measure a temperature of the battery 910. In the second board, in an area in which the first board is disposed in the first direction, a connection portion 940 for electrical connection to the first board may be provided; thus, an electrical signal transferred from the thermistor 930 can be provided to the processor mounted in the first board.

Figure 10:
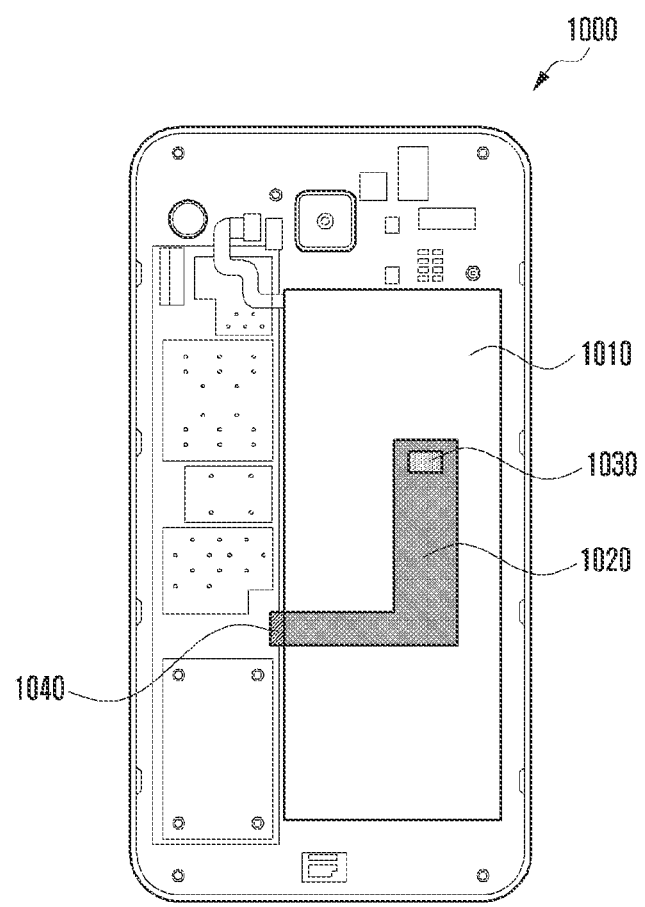

Referring to FIG. 10, a second board 1020 may be provided in various forms (e.g., T-shaped form); thus, a thermistor 1030 can be disposed in various areas of a battery 1010. For example, in an embodiment described with reference to FIG. 10, the second board 1020 is extended to a position of the upper end of the battery, compared with an embodiment described with reference to FIG. 9; thus, the thermistor 1030 can be disposed to measure a temperature of a corresponding area. Also, a connection portion 1040 for electrical connection to the first board may be provided.

According to various embodiments, an electronic device 1000 includes a plurality of thermistors to measure a temperature of various elements (e.g., a cover, battery) of the electronic device using each thermistor.

Figure 11:
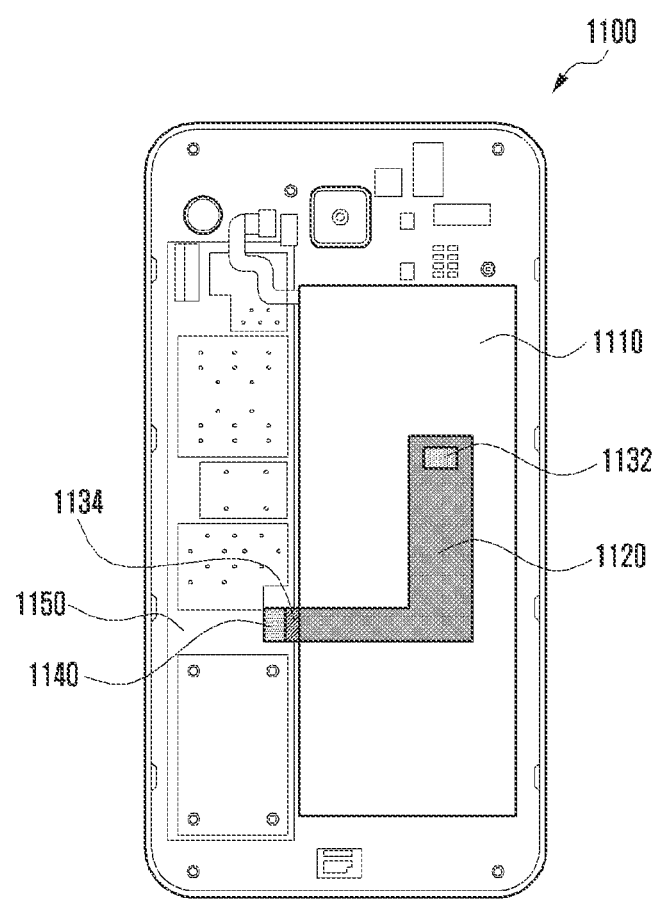

Referring to FIG. 11, in an area of an electronic device 1100 in which a battery 1110 is disposed in a first direction of the second board 1120, a first thermistor 1132 may be disposed, and in an area in which a first board 1150 is disposed in a first direction, a second thermistor 1134 may be disposed. Here, the first thermistor 1132 is disposed in a first direction of the second board 1120, i.e., a direction close to the battery 1110 to measure a temperature of the battery 1110, and the second thermistor 1134 is disposed in a second direction of the second board 1120, i.e., a direction adjacent to the rear housing to measure a temperature of the rear housing. In the embodiment, in an area in which the first board 1150 is disposed in a first direction of the second board 1120, a connection portion 1140 for electrical connection to the first board 1150 is provided; thus, an electrical signal transferred from the first thermistor 1132 and the second thermistor 1134 can be provided to a processor (e.g., the processor 210 of FIG. 2) mounted on the first board 1150.

Figure 12:
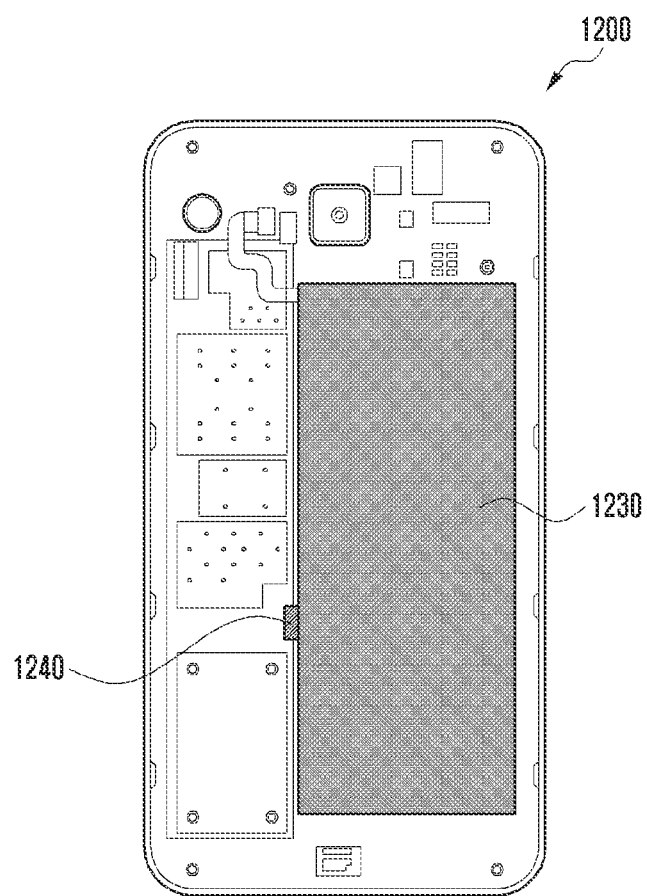

FIG. 12 illustrates a disposition form of a sheet type thermistor.

According to various embodiments, an electronic device 1200 may include a sheet type thermistor 1230. For example, the sheet type thermistor 1230 may be formed in a sheet or film type by widely spreading an NTC material, which is a constituent element of the thermistor.

Referring to FIG. 12, the sheet type thermistor 1230 may cover all or a portion of a battery area to measure a temperature of the battery. In the embodiment, a first board may be disposed in a first direction of at least a portion of the sheet type thermistor 1230 to provide a connection portion 1240 for electric connection to the first board.

Figure 13:
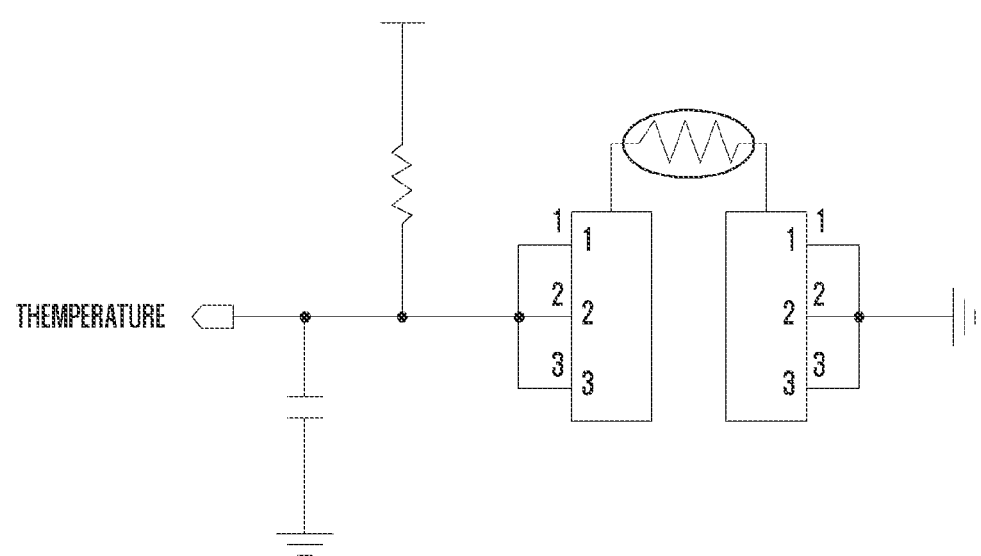
FIG. 13 is a diagram of a circuit for detecting a temperature of an electronic device according to an embodiment of the disclosure.

FIG. 13 is a diagram of a circuit for detecting a temperature of an electronic device according to an embodiment of the disclosure.

According to various embodiments, the thermistor may be formed in parallel to a pull-up resistor. When a temperature of the thermistor increases due to a heat generated within the electronic device, a resistance value of the thermistor increases; thus, a value of a current distributed to the thermistor and the pull-up resistor can be changed. A current value transferred from the thermistor (or the pull-up resistor) may be input to the processor, and the processor may measure a temperature of the thermistor through the current value.

FIG. 13 illustrates an example of a circuit configuration, and various embodiments of the disclosure are not limited thereto.

An electronic device according to various embodiments of the disclosure includes a housing (e.g., 410 of FIG. 4) configured to form an external shape thereof; a first board (e.g., 420 of FIG. 4) disposed in a first direction (e.g., a front direction) of the housing and in which at least one processor (e.g., 210 of FIG. 2) is mounted; a second board (e.g., 440 of FIG. 4) disposed between the housing and the first board and electrically connected to the first board; and a thermistor (e.g. 430 of FIG. 4) mounted on the second board, wherein the processor 210 measures a temperature of the housing based on an electrical signal received from the second board.

According to various embodiments, the thermistor (e.g., 430 of FIG. 4) may be disposed at a second surface of a second direction (e.g., a rear direction) opposite to the first direction of the second board (e.g., 440 of FIG. 4).

According to various embodiments, in a first surface of the first direction of the housing (e.g., 410 of FIG. 4), a hole (415 of FIG. 4) may be formed in at least a partial area in which the thermistor (430 of FIG. 4) is disposed in the first direction.

According to various embodiments, the first surface may be attached to at least a portion of the second surface of the second board (e.g., 440 of FIG. 4), and the second surface positioned in a direction opposite to that of the first surface may further include at least one first structure (451 and 452 of FIG. 4) attached to at least a portion of the first surface of the housing (410 of FIG. 4).

According to various embodiments, the first structure (e.g., 451 and 452 of FIG. 4) may be made of a material having thermal conductivity of a reference value or less.

According to various embodiments, in an area in which the thermistor (e.g., 430 of FIG. 4) is disposed, a distance between the housing (e.g., 410 of FIG. 4) and the second board (e.g., 440 of FIG. 4) may be larger than a length of the first direction and the second direction of the thermistor.

According to various embodiments, the first surface may be attached to at least a portion of the second surface of the second direction of the thermistor (e.g., 430 of FIG. 4), and the second surface positioned in a direction opposite to that of the first surface may further include at least one second structure (e.g., 460 of FIG. 4) attached to at least one of the first surface of the housing (e.g., 410 of FIG. 4).

According to various embodiments, the second structure (e.g., 460 of FIG. 4) may be an insulator.

According to various embodiments, the thermistor (e.g., 730 of FIG. 7) may be disposed at the first surface of the first direction of the second board (e.g., 740 of FIG. 7).

According to various embodiments, the second surface of the second direction of the second board (e.g., 740 of FIG. 7) may be attached to the first surface of the housing (e.g., 710 of FIG. 7).

According to various embodiments, at least two connecting portions (e.g., 421 and 442 of FIG. 4) may be separate or included with the first board (e.g., 420 of FIG. 4) or the second board (e.g., 440 of FIG. 4) for electrical connection to the other of the first board (e.g., 420 of FIG. 4) and the second board (e.g., 440 of FIG. 4).

According to various embodiments, the electronic device may further include a battery (e.g. 910 of FIG. 9), wherein the thermistor (e.g., 930 of FIG. 9) may be disposed in an area in which at least a portion of the battery is disposed in the first direction in the second board (e.g., 920 of FIG. 9).

According to various embodiments, in at least a partial area of the first direction of the second board, at least a portion of the first board may be disposed, and in at least another partial area of the first direction of the second board, at least a portion of the battery may be disposed.

An electronic device according to various embodiments of the disclosure includes a housing (e.g., 410 of FIG. 4) configured to form an external shape thereof; a first board (e.g., 420 of FIG. 4) disposed in a first direction of the housing; and a thermistor (e.g. 430 of FIG. 4) disposed between the housing and the first board, wherein a distance of the first direction between the thermistor and the housing is smaller than that of the first direction between the thermistor and the first board.

According to various embodiments, the thermistor (e.g., 430 of FIG. 4) may be mounted at a first surface of the first direction of the second board (440 of FIG. 4) electrically connected to the first board (e.g., 420 of FIG. 4) or a second surface of a second direction opposite to the first direction.

According to various embodiments, the thermistor (e.g., 430 of FIG. 4) may not come in physical contact with the housing (e.g., 410 of FIG. 4).

According to various embodiments, the electronic device may further include a first structure (e.g., the second board 440 of FIG. 4) disposed in the first direction of the thermistor (e.g., 430 of FIG. 4) and configured to block a heat transferred in a second direction opposite to the first direction in the first board (e.g., 420 of FIG. 4); and a second structure (e.g., 451 and 452 of FIG. 4) disposed in a third direction perpendicular to the first direction and the second direction of the thermistor and configured to block a heat transferred from the outside to the thermistor and/or transferred from the thermistor to the outside.

An electronic device according to various embodiments of the disclosure includes a housing configured to form an external shape thereof; a battery (e.g., 1110 of FIG. 11) disposed in a first direction of the housing; a first board (1150 of FIG. 11) disposed in the first direction of the housing; a second board (e.g., 1120 of FIG. 11) in which at least a portion of the battery is disposed in the first direction of the first area and in which at least a portion of the first board is disposed in the first direction of a second area different from the first area; and a first thermistor (e.g., 1132 of FIG. 11) mounted in the first area of the second board and a second thermistor (e.g., 1134 of FIG. 11) mounted in the second area of the second board.

According to various embodiments, the first board (e.g., 1150 of FIG. 11) may include at least one processor 210, and wherein the at least one processor 210 may be configured to determine a temperature of the battery (e.g., 1110 of FIG. 11) based on an electrical signal transmitted from the first thermistor (e.g., 1132 of FIG. 11) and to determine a temperature of the first board (e.g., 1150 of FIG. 11) based on an electrical signal transmitted from the second thermistor (e.g., 1134 of FIG. 11).

According to various embodiments, the first thermistor (e.g., 1132 of FIG. 11) may be disposed at the first surface of the first direction of the first area of the second board (e.g., 1120 of FIG. 11), and the second thermistor (e.g., 1134 of FIG. 11) may be disposed at a second surface of a second direction opposite to the first direction of the second area of the second board.

According to various embodiments of the disclosure, a temperature detection structure of an electronic device that can accurately sense a temperature of a cover and a battery can be provided.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A portable communication device comprising:
   a housing;
   a display accommodated in the housing;
   a first printed circuit board (PCB) accommodated in the housing;
   a second PCB accommodated in the housing and disposed between the display and the first PCB, the second PCB substantially parallel to the first PCB and electrically connected with the first PCB;
   a connector disposed between the first PCB and the second PCB such that a first portion and a second portion of the connector are connected to the first PCB and the second PCB, respectively;
   a first thermistor disposed on a first surface of the second PCB facing the display and is spaced apart from the display;
   a structure for preventing contact being disposed between the first thermistor and the display such that the first thermistor is not directly contact with the display; and
   a processor disposed between the first PCB and the second PCB, the processor configured to obtain an electrical signal corresponding to a temperature measured by the first thermistor.

2. The portable communication device of claim 1, wherein the structure includes an electrical insulating material.

3. The portable communication device of claim 1, wherein the first thermistor is disposed adjacent to a battery of the portable communication device.

4. The portable communication device of claim 3, wherein the first thermistor is configured to measure a temperature of an area in proximity of the battery.

5. The portable communication device of claim 1, further comprising:
   a second thermistor,
   wherein the second thermistor is disposed on a first surface of the first PCB facing the second PCB.

6. The portable communication device of claim 5, wherein the second thermistor is disposed adjacent to the processor.

* * * * *